United States Patent
Zoeppig

(10) Patent No.: US 10,698,011 B2
(45) Date of Patent: Jun. 30, 2020

(54) CLIP-ON AMMETER

(71) Applicant: NIDEC DRIVEXPERT GMBH, Ilmenau (DE)

(72) Inventor: Veit Zoeppig, Langewiesen (DE)

(73) Assignee: NIDEC driveXpert GmbH, Ilmenau (DE)

( * ) Notice: Subject to any disclaimer, the term of this patent is extended or adjusted under 35 U.S.C. 154(b) by 510 days.

(21) Appl. No.: 15/509,046

(22) PCT Filed: Sep. 2, 2015

(86) PCT No.: PCT/DE2015/000436
§ 371 (c)(1),
(2) Date: Mar. 6, 2017

(87) PCT Pub. No.: WO2016/034162
PCT Pub. Date: Mar. 10, 2016

(65) Prior Publication Data
US 2017/0269130 A1    Sep. 21, 2017

(30) Foreign Application Priority Data

Sep. 4, 2014   (DE) .................... 20 2014 007 077 U

(51) Int. Cl.
*G01R 15/18* (2006.01)
*G01R 19/257* (2006.01)
(Continued)

(52) U.S. Cl.
CPC .............. *G01R 19/257* (2013.01); *G01R 1/22* (2013.01); *G01R 15/186* (2013.01); *G01R 15/202* (2013.01); *G01R 15/207* (2013.01)

(58) Field of Classification Search
CPC ...... G01R 1/22; G01R 15/186; G01R 15/202; G01R 19/257
See application file for complete search history.

(56) References Cited

U.S. PATENT DOCUMENTS

| 5,168,435 A | 12/1992 | Kobayashi et al. |
| 7,529,069 B1 * | 5/2009 | Weems, II .......... G01R 31/025 361/42 |

(Continued)

FOREIGN PATENT DOCUMENTS

| DE | 102004036540 A1 * | 12/2005 | ......... G01R 1/06788 |
| DE | 202009014382 U1 | 11/2010 | |
| EP | 2602922 A2 | 6/2013 | |

OTHER PUBLICATIONS

Kollman et al., Powering electronics from the USB port (Year: 2002).*

(Continued)

*Primary Examiner* — Patrick Assouad
*Assistant Examiner* — Demetrius R Pretlow
(74) *Attorney, Agent, or Firm* — Laurence A. Greenberg; Werner H. Stemer; Ralph E. Locher

(57) ABSTRACT

A clip-on ammeter includes a current measurement unit, an evaluation unit and a USB interface. The current measurement unit records current values and provides the current values as measurement values for transfer purposes. The evaluation unit includes an ND converter and is connected to the current measurement unit. The evaluation unit allows the measurement values to be transmitted in a processable form as USB compatible digital data to the USB interface. The USB interface is connected to the evaluation unit and the USB interface allows the USB compatible data to be made available for transfer purposes to be further processed. The evaluation unit is energized via the USB interface. The clip-on ammeter includes a voltage transformer. The voltage transformer provides a stabilized voltage as a reference voltage for the current measurement unit.

5 Claims, 4 Drawing Sheets

(51) Int. Cl.
  *G01R 1/22* (2006.01)
  *G01R 15/20* (2006.01)

(56) References Cited

U.S. PATENT DOCUMENTS

| | | | | |
|---|---|---|---|---|
| 9,020,685 B2* | 4/2015 | Maruyama | ......... | G01R 33/0385 324/529 |
| 2009/0128125 A1* | 5/2009 | Garland | ............... | G01R 15/125 324/115 |
| 2010/0090683 A1* | 4/2010 | Bose | ................... | G01R 15/202 324/117 H |
| 2010/0231198 A1* | 9/2010 | Bose | ................... | G01R 15/207 324/117 H |
| 2010/0237853 A1* | 9/2010 | Bose | ................... | G01R 33/025 324/117 H |
| 2013/0245965 A1* | 9/2013 | Kane | ........................ | G01D 7/00 702/33 |
| 2014/0035607 A1* | 2/2014 | Heydron | ................... | G01R 1/04 324/754.02 |
| 2014/0039838 A1* | 2/2014 | Katz | ........................ | G01R 1/04 702/188 |
| 2014/0266287 A1* | 9/2014 | Reeder, III | ........... | G01R 1/0408 324/759.01 |
| 2014/0278255 A1* | 9/2014 | Anderson | ............. | G01M 99/00 702/189 |
| 2015/0022181 A1* | 1/2015 | Anderson | ................ | H04Q 9/00 324/114 |
| 2015/0102800 A1* | 4/2015 | Deokar | ................ | G01R 31/026 324/76.11 |
| 2016/0329745 A1* | 11/2016 | Linder | ................ | H02J 13/0062 |

OTHER PUBLICATIONS

Catalogue "World Class Test and Measuring Instruments for a Global Marketplace", 2002, Kyoritsu Electrical Instruments Works, Ltd., Tokyo, Japan.
Datenlogger, "PC-unabhaengig and robust", Vogel Business Media, 2015;—Statement of Relevance—.
Vom USB-Kombi-Messgeraet zur Allround-Messbox, https://www.elektrotechnik.vogel.de/messtechnik-prueftechnik/articles; Jun. 30, 2015; —Statement of Relevance—.

* cited by examiner

CLIP-ON AMMETER

BACKGROUND OF THE INVENTION

Field of the Invention

The invention relates to a clip-on ammeter for measuring current values in an electrical conductor.

Clip-on ammeters are already known in prior art in different embodiments and are used for indirect current measurements, i.e. via the detection of a static or alternating magnetic field generated around an electrical conductor.

One embodiment comprises, for example, so-called clip-on ampere multimeters which record a current applied as an analog measurement value and output it as a digital value via an integrated indicating device, in particular a display.

Moreover, clip-on ammeters are known which are to be connected to oscilloscopes and also record an applied current as an analog measurement value but cannot output it directly.

In this case, the corresponding measurement value is output by the oscilloscope to be connected.

The decisive disadvantage of such clip-on ammeters which are to be connected to oscilloscopes is the requirement that the corresponding clip-on ammeter is compatible to the oscilloscope used so that, normally, a universal use of a clip-on ammeter with different oscilloscopes is not possible.

In addition to this, the mentioned clip-on ampere multimeters and clip-on ammeters to be connected to oscilloscopes have the disadvantage that they require energy to power the integrated measurement and transformer electronics, particularly for amplifying recordable, static magnetic field signals. Usually, the power is supplied by external devices, in case of the connection of a clip-on ammeter to an oscilloscope possibly, for appropriate oscilloscopes, by the oscilloscope itself via device-specific plug systems, or by energy sources, for example a battery, integrated into the corresponding clip-on ammeter.

A further disadvantage of such clip-on ammeters is that, depending on the accuracy provided by them, they are very expensive.

Furthermore, in prior art clip-on ammeters are known which can be operated without an additional power supply. However, such clip-on ammeters are only capable to record alternating currents on the basis of the developing alternating fields. Measurement values of direct currents cannot be recorded by the clip-on ammeters mentioned.

The utility model specification DE 20 2009 014 382 U1 discloses a current measurement device which comprises a USB interface for the energy supply of the measurement unit and for the data transfer to an evaluation unit.

The disadvantage of the solution described in this patent specification is mainly based on the fact that the voltage applied via the USB interface according to the USB standard of about 5 V is only stable to a limited extent and if it is used as a reference voltage for direct current measurements, measurement data of less accuracy are the result.

Summary of the Invention

The task of this invention is to provide, by avoiding the disadvantages of the prior art, a universally usable clip-on ammeter which can record measurement values both of alternating and direct currents and which, moreover, offers a very high accuracy and particularly allows the precise registration of direct current values without a separate power supply and which can be simultaneously provided in a cost-effective manner.

This task is solved by the features described in the independent claim(s). Advantageous further developed embodiments are set forth in the dependent claims.

A clip-on ammeter according to this invention comprises a current measurement unit, an evaluation unit and a USB interface. Furthermore, the clip-on ammeter comprises additional components, such as for example a divisible core; however, these components correspond to the common components of clip-on ammeters known and therefore they will not be explained in detail in the following.

The current measurement unit of the invention is capable to detect current values and to provide the values detected as measurement values in a transmissible form.

The current measurement unit is designed, for example, as a Hall sensor and the technical processes running during the detection of the current values, particularly the clamping around the corresponding electrical conductor and the registration of the magnetic field generated around the conductor, correspond to the mode of operation of commonly used clip-on ammeters and therefore they are assumed to be known and will not be explained in detail.

The measurement values which can be provided in a transmissible form by the current measurement unit are particularly analog measurement values.

The evaluation unit of this invention is connected to the current measurement unit. It is capable to record and process the measurement values provided in a transmissible form by the current measurement unit. For this purpose, the evaluation unit is equipped with an analog-digital converter, hereinafter also referred to as an A/D converter, which converts the analog measurement values provided by the current measurement unit into digital measurement values.

In addition to this, the evaluation unit is connected to the USB interface.

A significant feature of the clip-on ammeter of this invention is, in particular, the additional capability of the evaluation unit to provide the digital measurement values as USB-compatible data, wherein these USB-compatible data can be transmitted from the evaluation unit to the USB interface.

In this process, the digital measurement values are specified according to a corresponding USB data protocol.

According to the invention, the USB interface allows the USB-compatible data to be made available in a transmissible form for external further processing.

Another essential feature of the invention is the fact that voltage is also supplied to the evaluation unit by the USB interface via the connection of the evaluation unit to the USB interface.

In this design, the USB interface is an electric/mechanical standard for a connecting unit by means of which the clip-on ammeter can be connected to an external data processing unit, and by means of which the USB-compatible data can be transferred from the clip-on ammeter to the correspondingly connected, external data processing unit and via which power is simultaneously supplied to the evaluation unit.

A particular advantage is that all USB-capable data processing units with the appropriate data processing software can be used as external data processing units; wherein portable devices such as, for example, laptops, tablets or smartphones, which are provided with an appropriate data processing software and which can display as well as process and store the USB-compatible data of the clip-on ammeter, are preferentially used. Because normally a measuring person, for example an electrician, carries such portable devices in any case during his job, it is a special advantage of this clip-on ammeter that additional units for displaying and processing/storing the measurement values recorded by the clip-on ammeter are not required thanks to the devices carried by these persons in any case.

Simultaneously, it is also a particular advantage that power is supplied to the evaluation unit via the USB interface, wherein the energy required by the evaluation unit is provided by the external data processing unit, which can be connected to the USB interface, and is transmitted to the evaluation unit via the USB interface.

According to the common USB 2.0 standard, for example, the USB interface provides a stabilized voltage of 5 V±5% and a current of up to 500 mA.

The clip-on ammeter of this invention comprises a voltage transformer which is assigned to the USB interface and energized by the voltage applied at the USB interface.

The voltage transformer is capable to deliver a stabilized voltage as a reference voltage for the current measurement unit.

This function is based on the fact that the current measurement unit for direct current measurements is designed as a Hall sensor which must be powered by a reference voltage. Due to the direct relation between the reference voltage and the measurement value applied at a Hall sensor, the high constancy of the stabilized voltage, or of the resulting current, makes it possible to achieve a high measurement accuracy for a direct current measurement.

It is a further advantage that a reliable reference voltage supply is guaranteed without the need for additional constant voltage sources, such as a battery, an accumulator or separate reference voltage sources. Therefore, it is not necessary any longer to monitor the charge status and to recharge the accumulator or to replace a discharged battery; the clip-on ammeter is always ready for operation in this design. Moreover, a drop of the reference voltage, typical for accumulators or batteries if they are almost discharged, and the resulting measurement inaccuracy or the need for readjustment are avoided in this way.

Thus, the clip-on ammeter of this invention offers the apparent technological advantages that it can be universally connected to any USB-capable, external data processing unit via the USB interface and that the energy required for the evaluation unit is also reliably supplied by the USB interface and that a stabilized reference voltage is supplied by the voltage transformer to the current measurement unit and that, therefore, the precise recording of the measurement values of direct currents is made possible. Additional systems for energizing the evaluation unit or for supplying the stable reference voltage, such as batteries or external sources and device-specific or additional connection lines, are not necessary any more.

Moreover, a clip-on ammeter according to this invention can be provided in a cost-effective manner, particularly due to the avoided additional units, and, simultaneously, the impact on the environment is reduced because batteries are not required.

In a preferential further development of the clip-on ammeter of this invention, the current measurement unit is designed as an intelligent measurement chip and particularly capable to preprocess current values recorded and to provide the preprocessed current values as measurement values which can be transferred to downstream units.

An intelligent measurement chip is to be understood as a measurement chip which is capable to linearize a measurement characteristic curve of the measurement values to be provided and compensate errors, in particular such caused by temperature influences or operating voltage changes.

The intelligent measurement chip can be optionally provided with additional performance features. Such an additional performance feature can be the capability to parametrize the intelligent measurement chip by means of the external data processing unit and this means that, for example, a measurement sensitivity or an offset of the intelligent measurement chip can be adjusted or that an additional error compensation of external error sources or influences, such as assembly or tolerance inaccuracies, can be executed by the external data processing unit.

In the further development described, the current measurement unit preferably has a separate connection to the USB interface, wherein said connection is particularly used to supply energy to the current measurement unit.

Alternatively, the current measurement unit can be energized indirectly via the evaluation unit.

The design of the current measurement unit as an intelligent measurement chip offers the particular technological advantage that the measurement values determined can already be prepared in the measurement chip so that the evaluation unit is released from these processing operations.

Thus, the measurement values can be subsequently processed in a simpler and, above all, more energy-saving manner in the evaluation unit so that the resulting power requirement of the clip-on ammeter of the invention is particularly low in this preferred further development.

It is a particular advantage that, according to this preferred further development, the energy supply to the clip-on ammeter of the invention can also be provided and maintained for a longer period of time by smaller portable USB-capable data processing units, such as smartphones.

Due to the feature of the invention which enables the parametrization of the measurement chip, the manufacturer of the clip-on ammeter can, as a further advantage, set a product-specific measurement sensitivity of the measurement chip and thus, depending on the design of the clip-on ammeter, different levels of measurement accuracy and/or different measurement ranges can be predefined.

Moreover, in a preferred variant of the invention, the clip-on ammeter comprises an energy buffer storage which temporarily buffers the energy needed to power the evaluation unit.

According to the invention, energy is supplied to the energy buffer storage by the external data processing unit connected to the USB interface and via the USB interface, wherein optionally either the energy buffer storage is powered alone or the energy buffer storage and the evaluation unit are powered in parallel via the USB interface.

Furthermore, the energy for the evaluation unit can also be provided only by the energy buffer storage.

In the present variant, two operating modes can be provided for power-supply purposes.

In the first operating mode, the energy is supplied by the external data processing unit via the USB interface. Preferentially, the USB interface can supply power either to the energy buffer storage alone or to the energy buffer storage and the evaluation unit in parallel. In the latter case, the energy supply to the energy buffer storage runs in parallel with the actual power supply to the evaluation unit. Depending on the performance of the external data processing unit, the energy can be supplied to the evaluation unit and to the energy buffer storage with time offsets and not simultaneously. For this purpose, an energy management unit can be additionally assigned to the energy buffer storage.

In the second operating mode, the energy supply to the evaluation unit can be maintained by the loaded energy buffer storage, even if the energy is not provided by the external data processing unit via the USB interface.

In the variant described, the clip-on ammeter further comprises a data storage in which the digital measurement values of the evaluation unit can be stored temporarily and provided in a transmittable form.

According to the invention, the data storage is connected to the evaluation unit so that the evaluation unit can store the digital data in the data storage, if required, and recall them once the USB connection has been re-established.

Optionally, the data storage can have an additional direct connection to the USB interface, wherein the digital values are preferentially stored as USB compatible data in the data storage so that the external data processing unit can, if required, directly access the USB compatible data of the data storage via the USB interface.

The variant described here offers the particular technological advantage that the clip-on ammeter can be temporarily operated independently, i.e. without an external energy supply and without transfers of measurement values to an external data processing unit.

On the one hand, the mobility of the clip-on ammeter can be additionally improved in this way—an advantage which is particularly important for measurement points which are difficult to access or on a high potential. On the other hand, a possible energy supply shortage or a temporary failure of the external data processing unit which can occur, for example, in the event of a short-term failure of the external data processing unit can be compensated for a limited period of time.

In a preferred further development, the clip-on ammeter comprises an indicating unit in combination with the energy buffer storage which can display the remaining usable energy, or a remaining useful time, and which is capable to output an alarm signal if the amount of residual energy is less than a critical minimum value.

In a further variant of the clip-on ammeter of the present invention, the ammeter moreover comprises an indicating unit which is capable to display the measured current value as a digital value parallel to its further processing in the evaluation unit.

In a particularly advantageous embodiment of the clip-on ammeter, it includes a signal processing unit which is connected to the clip-on ammeter and which serves to record the measurement values as analog signals and to process them to analog data. In particular, the measurement values are processed by voltage amplification and, if necessary, by voltage displacement so that a good graphic representation with high resolution can be obtained, by an oscilloscope in particular.

According to the invention, the signal processing unit is connected to the voltage transformer and is powered by the latter with a bipolar voltage of preferentially +/−5 V.

Another feature of the further development just described is that the clip-on ammeter comprises an analog output which is connected to the signal processing unit and is capable to output the analog data.

It is a particular advantage that the clip-on ammeter can be connected via the analog output with an oscilloscope which can indicate the analog data.

Compared to conventional solutions, the operation of the clip-on ammeter of the invention with a voltage transformer in the further development presented, makes it possible to use the complete range of +/−5 V for an analog output of the analog data.

Thus, the further development just mentioned has the particular advantage to be capable to output the measurement values both digitally via the USB data connection and as analog data via the analog output.

In a preferred embodiment of the clip-on ammeter, the evaluation unit is moreover capable to provide a control signal for zero setting purposes and to transmit it to the signal processing unit. This signal is provided as an analog signal via a D/A converter integrated in the evaluation unit. In this embodiment, the evaluation unit comprises a control signal output and the signal processing unit comprises a signal input, wherein the signal output is connected to the signal input. The generation of the control signal in the evaluation unit is preferentially initiated by a push on a button or by using an external data processing unit via the USB data connection.

The control signal enables the signal processing unit to set the analog data to zero. In this way, a calibration of the analog output of the clip-on ammeter is made possible so that a zero line will be displayed, for example, on an oscilloscope, if no current is flowing in the electrical conductor to be measured.

BRIEF DESCRIPTION OF THE SEVERAL VIEWS OF THE DRAWING

In the following figures, different embodiments explain the invention in detail. They show.

DESCRIPTION OF THE INVENTION

Figure 1:
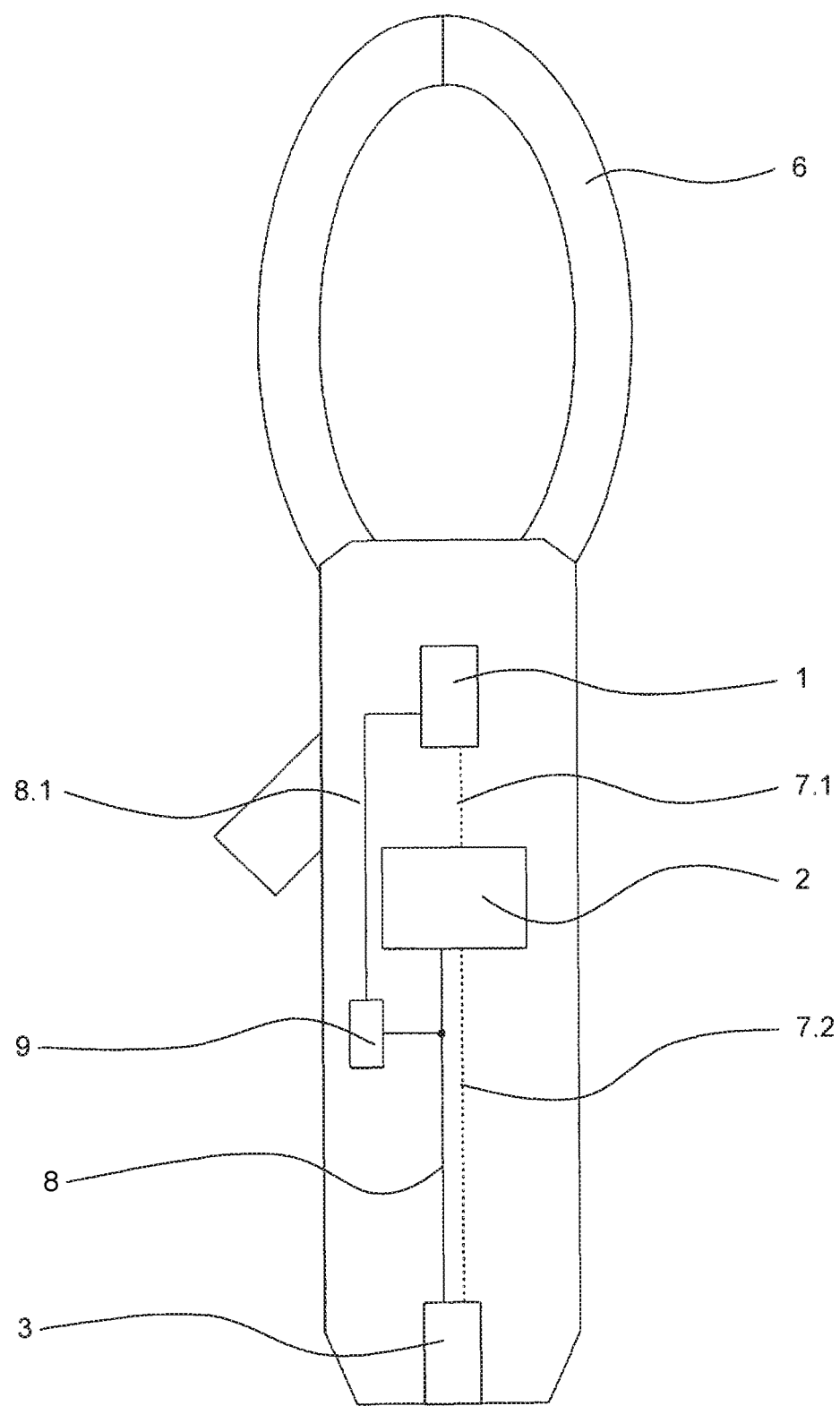
FIG. 1 schematic diagram with voltage transformer

FIG. 1 shows a schematic diagram of a clip-on ammeter of the present invention with a voltage transformer (9).

In the embodiment represented, the clip-on ammeter comprises a current measurement unit 1, an evaluation unit 2 and a USB interface 3.

Moreover, the clip-on ammeter is provided with a divisible ferrite core 6 which constitutes the head of the ammeter and which is clamped around the electrical conductor to be tested (not shown).

It is commonly known that the ferrite core 6 detects a magnetic field generated around the conductor.

In this embodiment, the current measurement unit 1 is positioned in an air gap (not shown) of the divisible ferrite core 6 and is capable to determine the appropriate current value on the basis of the detected magnetic field.

According to the embodiment represented, the current measurement unit 1 comprises a Hall sensor for direct current measurements.

In order to be able to precisely record measurement values of direct currents apart from the ones of alternating currents, the clip-on ammeter comprises a voltage transformer 9 which is integrated in the energy connection line 8 of the current measurement unit 1 and which converts the supply voltage provided via the USB interface 3 in a stabilized voltage. The stabilized voltage is used as a reference voltage for the HALL sensor of the current measurement unit 1.

In this embodiment, the stabilized voltage is provided as a bipolar voltage with a voltage value of +/−5 V.

The voltage transformer 9 shown in the embodiment is designed as a flyback transformer.

According to the embodiment, the current values are provided as measurement values, in particular as analog measurement values, and transmitted to the evaluation unit 2.

For this reason, the evaluation unit 2 is connected with the current measurement unit 1 via a connection line 7.1.

The evaluation unit 2 of the invention is capable, for example by means of an A/D converter (not shown), to convert the measurement values transmitted into digital measurement values and to provide them additionally as USB compatible values for transfer purposes.

The USB compatible data are transmitted from the evaluation unit 2 to the USB interface 3 via a further connection line 7.2.

According to the invention, the USB interface 3 is an electric/mechanic connection unit via which an external data processing unit (not shown), for example a laptop or a smartphone, can be connected to the clip-on ammeter.

It is a particular advantage of the invention that during the operation of the clip-on ammeter the USB compatible data can be directly transferred from the clip-on ammeter to the specific external data processing unit connected in which they can be further processed according to the requirements.

Thus, it is for example possible that the current values measured are indicated on the external data processing unit and/or stored there for further processing.

A further technological advantage is the fact that the USB interface 3 of the invention allows, depending on the application, the evaluation unit 2 to be permanently energized and also the current measurement unit 1 to be indirectly, via the voltage transformer 9, provided with a permanent reference voltage by the external data processing unit connected.

For this purpose, the evaluation unit 2 is also connected to the USB interface 3 via the energy connection line 8.

According to the invention, a voltage of about 5 V and a current of ≥100 mA are provided for the evaluation unit 2 here.

Thanks to the USB interface 3, the clip-on ammeter of the present invention can be universally connected to any USB capable data processing unit, wherein, as a particular advantage, additional energy sources for the clip-on ammeter, such as batteries, and additional indicating units for visualizing the current values measured are not required.

Compared to conventional clip-on ammeters, the present solution offers a universal connection and an improved mobility of the clip-on ammeter of the invention and, moreover, an accurate registration of direct current measurement values.

Figure 2:
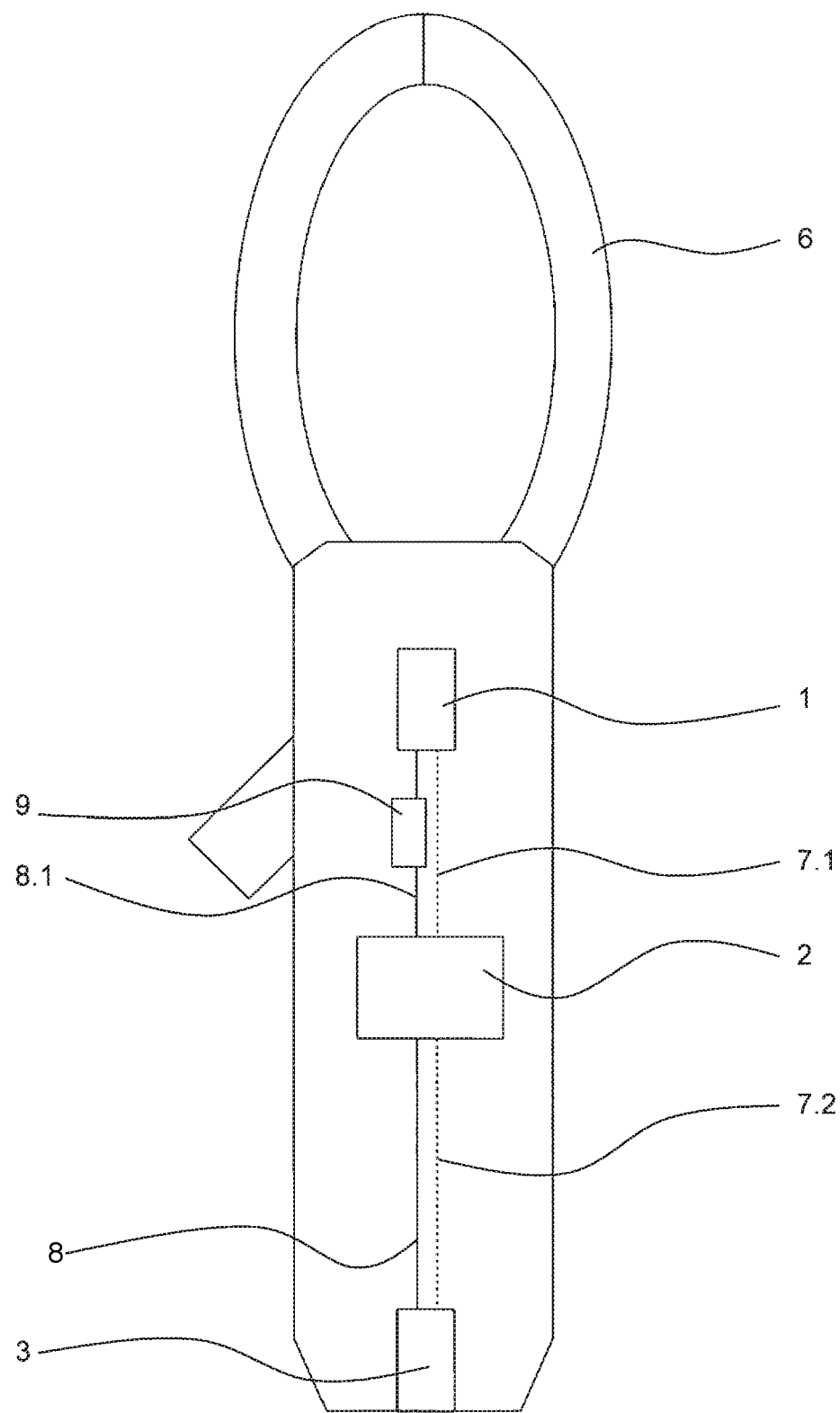
FIG. 2 schematic diagram with voltage transformer and looped voltage supply

FIG. 2 shows an embodiment of the clip-on ammeter of the present invention in which the current measurement unit 1 is indirectly powered via the evaluation unit 2. In this embodiment, the voltage transformer 9 is included in the energy connection line 8.1 to provide the reference voltage.

Figure 3:
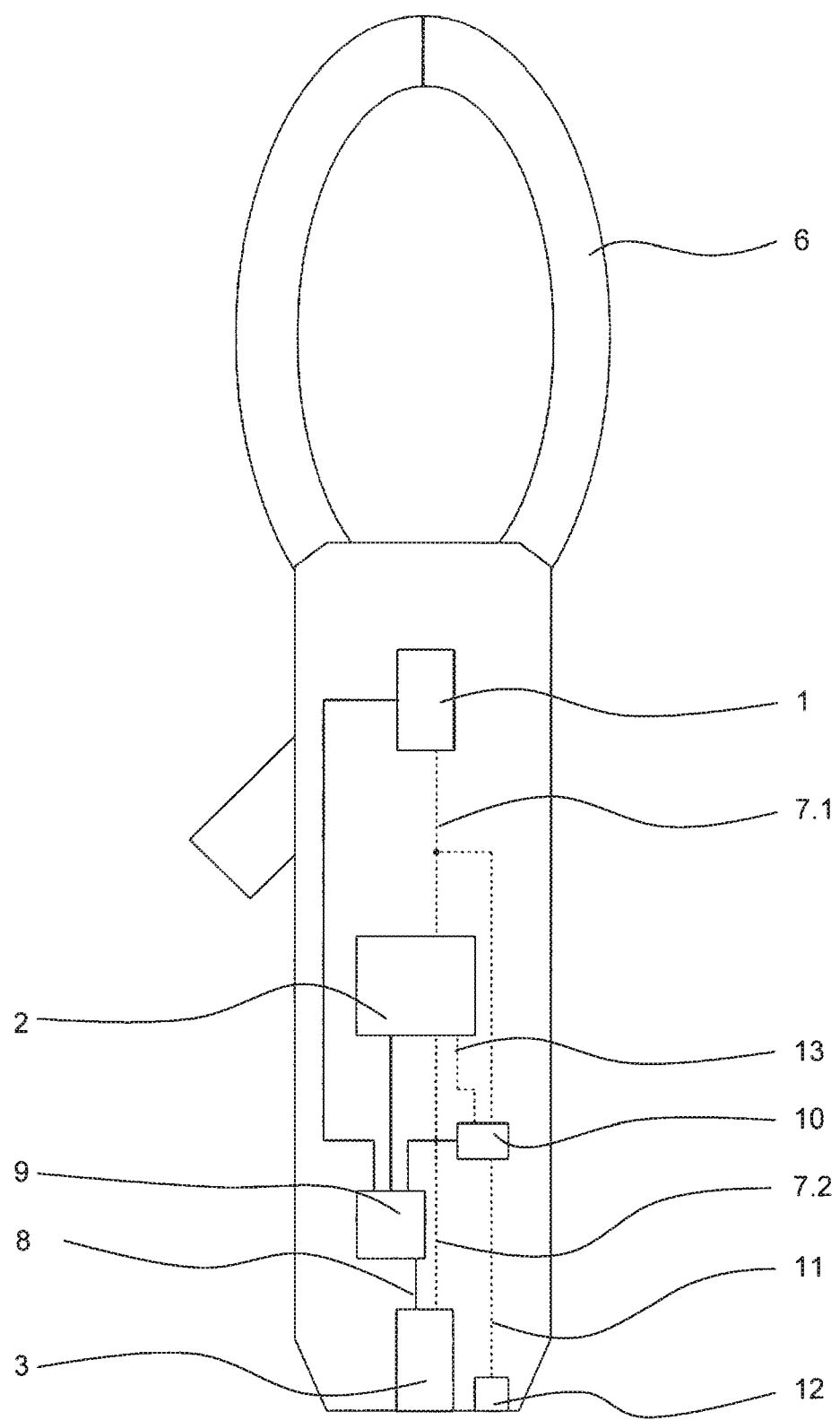
FIG. 3 schematic diagram with analog output

FIG. 3 represents an advantageous embodiment of the clip-on ammeter in which it additionally comprises an analog output 12, in particular for the connection to an oscilloscope (not shown).

To be able to output appropriate analog signals of the measurement values recorded, the clip-on ammeter of this embodiment comprises a signal processing unit 10 which is capable to record the measurement values as analog signals and to process them to analog data, particularly by voltage amplification and voltage displacement. Subsequently, the analog data can be provided for transfer via an analog connection line 11 and the analog output 12 to the oscilloscope connected.

FIG. 3 additionally shows that the voltage transformer 9 is included in the energy connection line 8 such that a stabilized reference voltage for the current measurement unit 1, a stabilized supply voltage for the evaluation unit 2, and a bipolar voltage for the signal processing unit 10 are made available via its output.

According to FIG. 3, digital and analog measurement values are processed and output in parallel in this embodiment.

FIG. 3 shows the special embodiment in which the evaluation unit 2 and the signal processing unit 10 are connected via a control signal connection line 13. Here, the valuation unit 2 is capable to provide an analog control signal via an integrated D/A converter (not shown) and to transmit it via a control signal output (not shown), the control signal connection line 13 and a control signal input (not shown) of the signal processing unit to the signal processing unit 10.

On the basis of such a control signal, the signal processing unit 10 can set the analog data to zero and, thus, it can perform a calibration of the analog output, for example, before the start of a new measurement.

Figure 4:
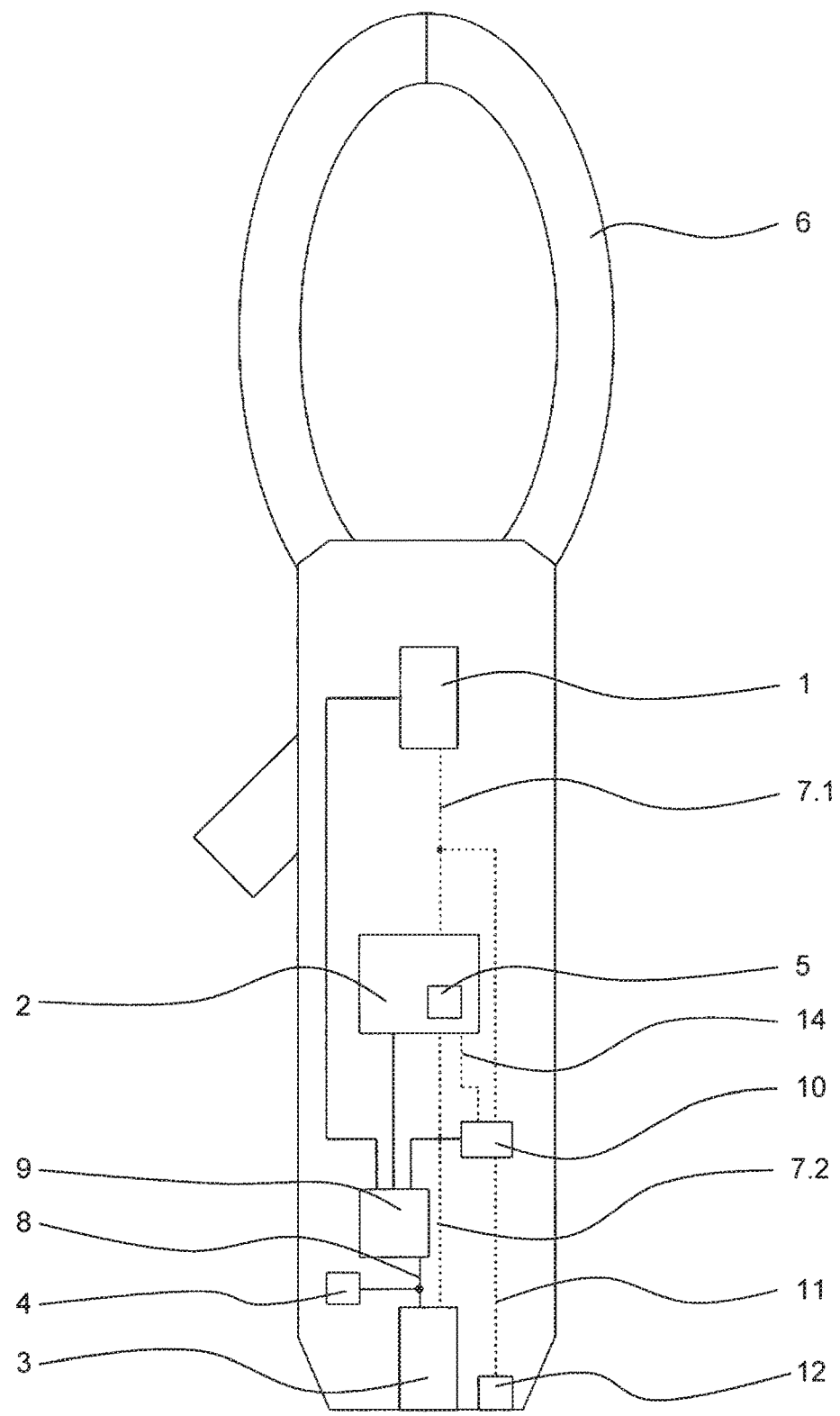
FIG. 4 schematic diagram with energy buffer storage and data storage.

FIG. 4 shows another embodiment of the clip-on ammeter. Compared to the variant illustrated in FIG. 3, the clip-on ammeter shown here additionally comprises an energy buffer storage 4 and a data storage 5, wherein the data storage 5 is assigned to the evaluation unit 2.

In the embodiment shown in this figure, the energy buffer storage 4 is included in the energy connection line 8 such that, during the operation of the clip-on ammeter, it is loaded with excess energy which is not required for the operability of the evaluation unit 2, the current measurement unit 1 and the signal processing unit 10.

This configuration creates the particular advantage that the energy required for the operation of the clip-on ammeter can be provided by the energy buffer storage 4 for a short time so that the clip-on ammeter is temporarily independent and can be operated without being connected to the data processing unit.

In the embodiment, the data storage 5 makes it possible that the measurement values recorded, in particular the measurement values which can be stored as USB compatible data in the data storage 5, are temporarily buffered.

The data storage 5, which is a component of the evaluation unit 2, can be prompted by an external data processing unit (not shown) connected to the USB interface 3 so that the buffered data can be retrieved, if required.

The integration of the energy buffer storage 4 and the data storage 5 offers the particular advantage that the clip-on ammeter can also be operated independently, i.e. without being connected to an external data processing unit so that the mobility of the clip-on ammeter can be additionally increased.

LIST OF REFERENCE NUMERALS 1 current measurement unit
2 evaluation unit
3 USB interface
4 energy buffer storage
5 data storage
6 divisible core
7 connection line
8 energy connection line
9 voltage transformer
10 signal processing unit
11 analog connection line
12 analog output
13 control signal connection line

The invention claimed is:

1. A clip-on ammeter, comprising:
a current measurement unit for recording current values being provided as measurement values;
an evaluation unit connected to said current measurement unit, said evaluation unit including an analog-digital converter; and
a USB interface connected to said evaluation unit for supplying power to said evaluation unit, said evaluation unit processing the measurement values to digital and USB compatible data for being transferred to said USB interface, the USB compatible data being provided by said USB interface for transfer purposes to be further processed;
a voltage transformer, said USB interface for supplying power to said voltage transformer, said voltage transformer for providing a stabilized voltage as a reference voltage for said current measurement unit.

2. The clip-on ammeter according to claim 1, wherein said current measurement unit is constructed as an intelligent measurement chip and said current measurement unit processes the current values measured and provides the current values processed as measurement values for transfer purposes.

3. The clip-on ammeter according to claim 1, further comprising:
an energy buffer storage being energized via said USB interface, said energy buffer storage providing an energy supply for said evaluation unit; and
a data storage for storing the measurement values processed and providing the measurement values for transfer purposes.

4. The clip-on ammeter according to claim 1, further comprising:
a signal processing unit connected to said current measurement unit, said signal processing unit recording measurement values as signals and processing the measurement values to analog data, said signal processing unit being powered with a bipolar voltage from said voltage transformer; and
an analog output connected to said signal processing unit and said analog output outputting analog data.

5. The clip-on ammeter according to claim 4, wherein said evaluation unit includes a control signal output and said signal processing unit includes a control signal input, said control signal output being connected with said control signal input via a control signal connection line, said evaluation unit providing a control signal for being transferred to said signal processing unit and said signal processing unit setting the analog data to zero on the basis of the control signal.

* * * * *